United States Patent [19]

Yoshizawa

[11] Patent Number: 4,526,805
[45] Date of Patent: Jul. 2, 1985

[54] FILM-FABRICATING METHOD AND APPARATUS FOR THE SAME

[75] Inventor: Shuji Yoshizawa, Tokyo, Japan

[73] Assignee: Tokyo Shibaura Denki Kabushiki Kaisha, Japan

[21] Appl. No.: 541,308

[22] Filed: Oct. 12, 1983

[30] Foreign Application Priority Data

Oct. 13, 1982 [JP] Japan ............................. 57-179305

[51] Int. Cl.³ ...................... B05D 3/06; C23C 12/08
[52] U.S. Cl. .................................. 427/38; 118/50.1;
118/719; 118/723; 118/730; 427/39; 427/255.2; 427/255.3; 427/255.5
[58] Field of Search ................. 118/723, 719, 50.1, 118/730; 427/39, 38, 255.5, 255.2, 255.3

[56] References Cited

U.S. PATENT DOCUMENTS

| | | | |
|---|---|---|---|
| 3,297,465 | 1/1967 | Connell et al. | 427/39 |
| 4,066,527 | 1/1978 | Takagi et al. | 427/39 |
| 4,161,418 | 7/1979 | Morimoto et al. | 427/39 |
| 4,397,885 | 8/1983 | Akai | 118/50.1 |

Primary Examiner—John D. Smith
Assistant Examiner—Janyce Bell
Attorney, Agent, or Firm—Cushman, Darby & Cushman

[57] ABSTRACT

In a film-fabricating apparatus, a reaction chamber and a film-forming chamber which contains a substrate on which a film is deposited are provided. Two chambers are communicated with each other by a communication device which allows for the conduction of activated molecular species grown in the reaction chamber to the film-forming chamber, and prevents light beams emitted during the decomposition of raw gas from being carried into the film-forming chamber. A first cylinder is connected to the reaction chamber, to supply a raw gas to the reaction chamber. An exhausting pump is connected to the film-forming chamber, to decompress the interior of the film-forming chamber. A pair of electrodes, one of which is connected to a power source and the other is grounded, are provided in the reaction chamber, to decompose the raw gas and product activated molecular species.

23 Claims, 5 Drawing Figures

FILM-FABRICATING METHOD AND APPARATUS FOR THE SAME

BACKGROUND OF THE INVENTION

This invention relates to a method of fabricating a thin film on a substrate and an apparatus for the same, and more particularly to a method of decomposing a raw gas and fabricating a thin film containing an element mainly consisting of the raw gas on the surface of the substrate and an apparatus for the same.

A film-forming method known so far which comprises the steps of decomposing a raw gas by glow discharge at reduced pressure and forming a film containing an element mainly consisting of the decomposed raw gas on the surface of a substrate involves a plasma chemical vapor deposition (abbreviated as "CVD") apparatus of the induced coupling or capacitive coupling type. The conventional plasma CVD apparatus comprises the steps of taking a raw gas into a decompressed reaction chamber; supplying high frequency power to a high frequency coil surrounding the reaction chamber or a pair of mutually facing electrodes provided in the reaction chamber; producing plasma by glow discharge out of the raw gas held in the reaction chamber; and depositing a film containing an element mainly consisting of the raw gas on the surface of a substrate placed in the reaction chamber.

Recently it was proposed to deposit a film over a broad surface of a substrate by decomposing a raw gas containing, for example, silicon by means of discharge. An amorphous silicon film which is deposited on a substrate can be used as a photosensitive material. Silane ($SiH_4$) is a most widely accepted as a silicon-containing raw gas. Accompanied with plasma flashing induced by the grow discharge of silane, various kinds of radicals and ions are produced. The those active species are deposited on a substrate surface. Thus, an amorphous silicon film containing hydrogen is fabricated on the surface of the substrate.

When, however, an amorphous silicon film is deposited particularly over a broad area, the above-mentioned conventional plasma CVD apparatus has the drawback that the deposition takes a long time. To eliminate the difficulties resulting from the long hours of silicon film deposition, it has been contemplated to apply a larger amount of high frequency power in the glow discharge in order to accelerate the deposition of the silicon film. However, a mere increase in high frequency power fails not only to deposit a silicon film with a uniform thickness over a broad area, but also to produce an amorphous silicon film of high quality. The reason why a high quality amorphous silicon film cannot be produced is that beams of light emitted from the plasma during the formation of the silicon film are projected on the silicon film in the process of being grown on the substrate surface, thereby breaking the bonding of the surface portion of an unstable active silicon film. Among the beams of light emitted from the plasma, ultraviolet rays in particular have extremely high energy, tending to produce a large amount of free radicals in the silicon film.

Thus, an increase in high frequency power only results in the greater intensity of emitted light beams and consequently the failure to form a high quality silicon film. The failure to produce a high quality silicon film is generally supposed to result from the fact that emission of a strong light results in a decline in the photoconductivity or dark-conductivity (referred to as "the Steabler-Wronski effect"). This phenomenon results from an increase in difficulties caused by emission of intense light beams. Quantitatively, this phenomenon is understood to arise from a reduction in the photoluminescence due to a dangling bond or an increase in the spin density in electron spin resonance (abbreviated as ESR).

With the conventional plasma-CVD apparatus, therefore, power consumption must be reduced in order to form a high quality silicon film, thereby making it impossible to accelerate the deposition of a silicon film.

SUMMARY OF THE INVENTION

This invention has been accomplished in view of the above-mentioned circumstances, and is intended to provide a method of fabricating a high quality thin film with a uniform thickness in a short time and also an apparatus for said method.

A film-fabricating method embodying this invention which comprises the steps of decomposing a raw gas to produce activated molecular species; and effecting the reaction of said activated molecular species, to deposit a film on the surface of a substrate placed in a film-forming chamber is characterized in that the raw gas is decomposed to produce activated molecular species prior to the deposition of a film in the film-forming chamber, and the activated molecular species thus produced are taken into the film-forming chamber.

A film fabricating apparatus embodying this invention comprises a reaction chamber, a film-forming chamber in which a substrate is placed, communicating means for effecting communication between the reaction chamber and film-forming chamber, raw gas-feeding means connected to the reaction chamber, decompression means connected to the film-forming chamber, and means which is provided in the reaction chamber to decompose a raw gas taken into the reaction chamber from the raw gas-feeding means, thereby producing activated molecular species.

The above-mentioned communication means is characterized by the function of conducting activated molecular species grown in the reaction chamber to the film-forming chamber and preventing light beams emitted by the decomposition of the raw gas from being carried into the film-forming chamber. Consequently, this invention can prevent light beams emitted by the decomposition of the raw gas from harmfully affecting a film in the process of being grown, thereby fabricating a thin film with a uniform thickness in a short time.

The surface of a film in the process of being grown remains unstable and active. If, therefore, light beams resulting from the decomposition of a raw gas happen to be radiated on the surface of said film, then the bonding of the surface portion of the film is broken to give rise to a danging bond. The occurrence of said dangling bond leads to defects in the film, thereby noticeably deteriorating its characteristics. According to the film-fabricating method of this invention, a raw gas is decomposed in a reaction chamber separate from a film-forming chamber in which the substrate is placed. Further provided between the film-forming chamber and reaction chamber is communication means which allows for the passage of activated molecular species obtained by the decomposition of the raw gas, but prevents light beams emitted at said decomposition from being carried forward. Accordingly, the film-fabricating method and apparatus of this invention produces a high quality film substantially free from defects. Further, the subject film-fabricating method and apparatus have the advantages of eliminating the harmful effect of light beams; accelerating a reaction for the decomposition of a raw gas during the formation of a film which is naturally accompanied with an increase in the intensity of light beams applied; elevating the density with which activated molecular species are grown; and consequently accelerating the film-fabricating speed.

DETAILED DESCRIPTION OF THE PREFERRED EMBODIMENTS

Figure 1:
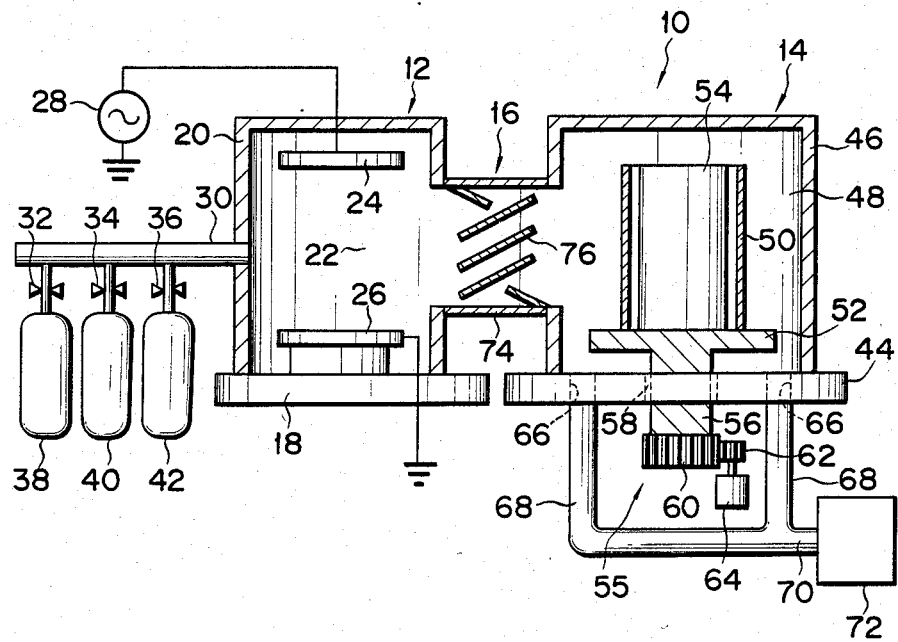
FIG. 1 is a schematic sectional view of a film-fabricating apparatus according to a first embodiment of this invention which involved the application of a film-fabricating method according to the invention.

Description will now be given with reference to FIGS. 1 and 2 of a film-fabricating apparatus according to a first embodiment of this invention. Referring to FIG. 1, a film-fabricating apparatus 10 according to a first embodiment of the invention is provided with a reaction device 12, film-forming device 14 and a communication device 16 for connecting together the reaction device and film-forming device 14.

The reaction device 12 comprises a first base borad 18 and a first casing 20 securely mounted on said first base board 18. A space surrounded by the first base board 18 and first casing 20 constitutes a reaction chamber 22. A pair of mutually facing electrodes 24, 26 are spatially arranged in the reaction chamber 22. One electrode 24 is connected to a high frequency power source 28, and the other electrode 26 is grounded.

Connected to the first casing 20 is a gas inlet pipe 30, one end of which is open to the reaction chamber 22. First, second and third cylinders 38, 40, 42 are connected to the gas inlet pipe 30 through the corresponding valves 32, 34, 36. The first cylinder 38 contains a raw gas of silane ($SiH_4$) used to form an amorphous silicon film. The gas inlet pipe 30, first valve 32 and first cylinder 38 jointly constitute raw gas introducing means.

The second cylinder 40 contains an additive gas which is to be mixed with the raw gas as need arises. The additive gas includes, for example, $GeH_4$, $SnCl_4$, $CH_4$, $C_2H_4$, $C_2H_6$, $N_2$, $NH_3$, $N_2O$ and $O_2$. $GeH_4$ or $SnCl_4$ is intended to substitute part of the film-forming silicon by Ge or Sn. A film containing silicon partly substituted by Ge or Sn has a higher sensitivity to a long wave light, and is adapted as a photosensitive body used with an electrostatic copying apparatus to which laser beams are applicable. The above-listed additive gases $CH_4$, $C_2H_4$, $C_2H_6$, $H_2$, $NH_3$, $N_2O$ and $O_2$ are mixed with the raw gas to substitute part the film-forming silicon (Si) by C, N or 0. A film containing silicon partly substituted by C, N or 0 has a large light energy gap.

The third cylinder 42 contains an impurity to be doped on a formed film. This impurity includes, for example, $B_2H_6$, $PH_3$, $AsH_3$. $B_2H_6$ is mixed with the raw gas to dope an impurity of B on a formed Si-containing film. With a Si-containing film doped with a minute amount of B, amorphous silicon having a physical function approximating that of an N type semiconductor is apparently turned into a intrinsic semiconductor, and when doped with a larger amount of B, is changed into a P type semiconductor. $PH_3$ and $AsH_3$ are mixed with the raw gas to dope an impurity of P or As on a formed Si-containing film. A Si-containing film doped with P or As is turned into an N type semiconductor.

In the foregoing embodiment, silane ($SiH_4$) was used as a raw gas. For the formation of an amorphous silicon film, however, it is unnecessary to exclusively use the silane. For instance, it is possible to apply silane of a higher order such as disilane ($Si_2H_6$) and trisilane ($Si_3H_8$).

The reaction device 12 of this invention constitutes a plasma CVD apparatus of the capacitive bonding type through the above-mentioned steps. The reaction device 12 decomposes and energizes the raw gas, additive gas and doping gas by glow discharge. This object is attained not only by the glow discharge, but also, for example, by the microwave discharge, thermal decomposition or photolysis.

The film-forming device 14 spatially arranged from the reaction device 12 comprises a second base board 44, and a second casing 46 detachably mounted on this second base board 44. A space surrounded by the second base board 44 and the second casing 46 jointly constitute a film-forming chamber 48. The film-forming chamber 48 contains a substrate 50 prepared from aluminium in a hollow cylindrical form with a diameter of 130 mm and an axial length of 289 mm. The substrate 50 is mounted on a rotatable stand 52. Provided substantially at the center of this rotatable stand 52 is a heater 54 for heating the substrate 50 to a prescribed temperature. A drive mechanism 55 is fitted to the stand 52 to rotate it around its axis. This drive mechanism 55 has a drive shaft 56 positioned at the center of the underside of the stand 52 in a state extending dounward. The lower end of the drive shaft 56 extends downward through the second base board 44. The intermediate portion of the drive shaft 56 is rotatably supported on the base board 44 by means of bearing 58, which holds the film-forming chamber 48 in an airtight state.

A driven gear 60 is concentrically fitted to the lower end of the drive shaft 56. A drive gear 62 is threadedly engaged with the driven gear 60. This drive gear 62 is concentrically fitted to one end of the rotary shaft of a motor 64. When, therefore, the motor 64 is actuated, the stand 52 is rotated.

A plurality of communication holes 66 penetrate the second base board 44. An exhaust branch pipe 68 communicates with each of the communication holes 66. These exhaust branch pipes 68 are collectively connected to a single main exhaust pipe 70. This main exhaust pipe 70 is connected to an exhausting pump 72 acting as decompressing means. When, therefore, an exhausting pump 72 is actuated, the interior of the film-forming chamber 48 is decompressed to draw off gases remaining therein. The exhausting pump 72 is connected to a gas cleaner (not shown). Gases drawn off by the exhausting pump 72 are released into the open air after being rendered harmless by the gas cleaner.

The previously described communication device 16 comprises a straight communication pipe 74 connected to the substantially control portions of the mutually facing lateral walls of the first casing 20 and second casing 46. The communication pipe 74 renders the reaction chamber 22 and film-forming chamber 48 communicable with each other. Namely, the raw gas decomposed in the reaction chamber 22, additive gas and activated molecular seeds of an impurity gas are brought into the film-forming chamber 48 through the communication pipe 74.

A plurality of baffle boards 76 are spatially arranged in the communication pipe 74. These baffle boards 76 are so designed as to allow for the passage of the aforementioned activated molecular species, but to obstruct the passage of light beams which are emitted from the reaction chamber 22 at the glow discharge. In other words, the communication device 16 allows the activated molecular species alone produced in the reaction chamber 22 to be carried into the film-forming chamber 48, and prevents light beams from being brought into the film-forming chamber 48.

Description will now be given of a film-fabricating method performed on the film-forming device 10 constructed as described above. The method comprises the steps of:

decompressing the interior of the film-forming chamber 48 by the exhausting pump 72;

opening the valves 32, 34, 36 to take the raw gas, additive gas and impurity gas into the reaction chamber 22 through the gas inlet pipe 30;

impressing a prescribed level of voltage between the mutually facing electrodes 24, 26 from the high frequency power source 28;

producing a glow discharge between the mutually facing electrodes 24, 26 to generate a plasma in the reaction chamber 22;

decomposing the raw gas, additive gas and impurity gas held in the reaction chamber 22 to provide various activated molecular species and emit intense light beams;

causing various activated molecular species grown in the reaction chamber 22 to be conducted into the film-forming chamber 48 through the spaces defined between the plurality baffle boards 76 of the communication device 16 and also through the communication pipe 74;

causing the activated molecular species carried into the film-forming chamber 48 to be deposited on the surface of the substrate 50 previously heated by the heater 54, and rotated by the drive mechanism 55.

Thus an amorphous silicon film is deposited on the surface with a uniform thickness. Light beams emitted from the plasma generated in the reaction chamber 22 are shut off by the plurality of baffle boards 76 of the communication device 16 are prevented from entering the film-forming chamber 48. Therefore, the formed amorphous silicon film is saved from exposure to light beams and retains high quality.

With the film-forming method of this invention, even when the capacity of the high frequency power source 28 is increased in order to accelerate the film-forming speed by producing various activated molecular species with a higher density, the formed amorphous silicon film does not deteriorate. The reason is that though an increase in the capacity of the high frequency power source naturally leads to a rise in the intensity of light beams emitted from the plasma, yet the plural baffle boards 76 of the communication device 16 stop the arrival of said light beams to the film-forming chamber 48; and consequently an amorphous silicon film in the process of being formed is not affected by emission of intense light beams. The film forming method according to the first embodiment of this invention accelerates the film-forming speed by elevating the capacity of the high frequency power source 28 without deteriorating the properties of the film produced.

An amorphous silicon film deposited on the surface of the substrate by the film-forming device 10 and method according to the first embodiment of this invention from a silicon-containing gas, for example silane gas with a proper additive gas and impurity gas mixed with the raw gas has proved effective when utilized as a photosensitive body of an electrostatic copying apparatus or a solar cell.

Description will now be given with reference to FIG. 2 of an example in which a film-fabricating method was performed under the following conditions on a film-forming device 10 according to the first embodiment of this invention.

Conditions of Example:
Raw gas: silane ($SiH_4$)
Flow rate of the raw gas: 150 to 1,000 (SCCM)
Temperature of the substrate: 250° C.
Pressure in the interior of the reaction chamber and film-forming chamber: 0.05 to 1.0 (torr)
High frequency power: 0 to 600 (W)
(frequency 13.56 MHz)

Figure 2:
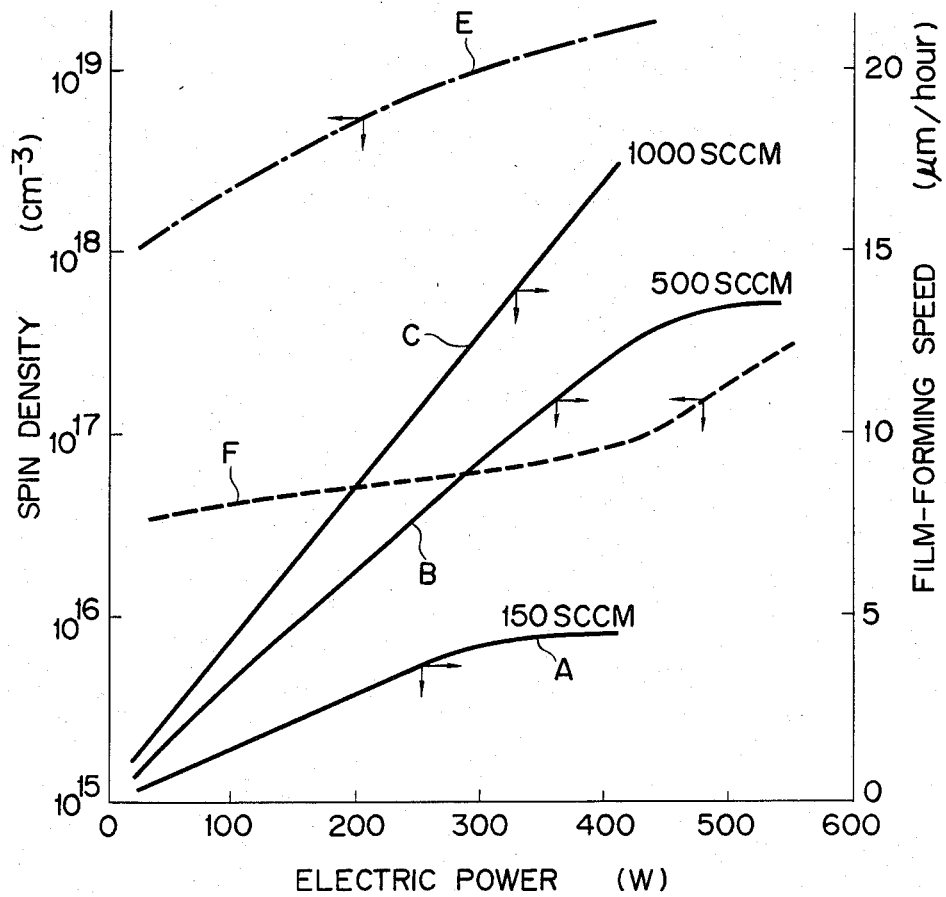
FIG. 2 is a curve diagram showing the relationship between the level of the electric power and the spin density and between the level of the electric power and the film-fabricating speed.

Referring to FIG. 2, solid lines A, B and C respectively indicate the relationships between the magnitude of power supplied and film-forming speed, where the flow rates of a raw gas were set at 150, 500 and 1,000 (SCCM). It is seen from FIG. 2 that an increase in the amount of high frequency power and the flow rate of the raw gas assure the elevation of the film-forming speed.

A one dot-dash line E represents the relationship between the spin density of the amorphous silicon film deposited by the conventional film-forming device and the magnitude of the power supplied, where the flow rate of the raw gas was set at 500 SCCM. A broken line F indicates the relationship between the spin density of the amorphous silicon film deposited by the film-forming apparatus and method according to the first embodiment of this invention and the magnitude of the power supplied, where the flow rate of the raw gas was set at 500 SCCM. It is seen from the relationships denoted by the lines E and F the film-forming apparatus and method daccording to the first embodiment of the invention enables an amorphous silicon film to be formed with a smaller spin density than has been experienced in the past. In other words, the first embodiment in which light beams emitted from a plasma is prevented from being directly ejected on a film in the process of being deposited assures the production of a high quality film little affected by difficulties resulting from the dangling bond.

It will be noted that this invention need not be practised exclusively by the arrangement applied in the aforementioned embodiment. The invention is applicable with various changes and modifications without departing from the scope and object of the invention. Description will now be given with reference to FIG. 3 of a film-fabricating apparatus and method according to a second embodiment of the invention. The parts of FIG. 3 the same as those of FIG. 1 are denoted by the same numerals, description thereof being omitted.

Figure 3:
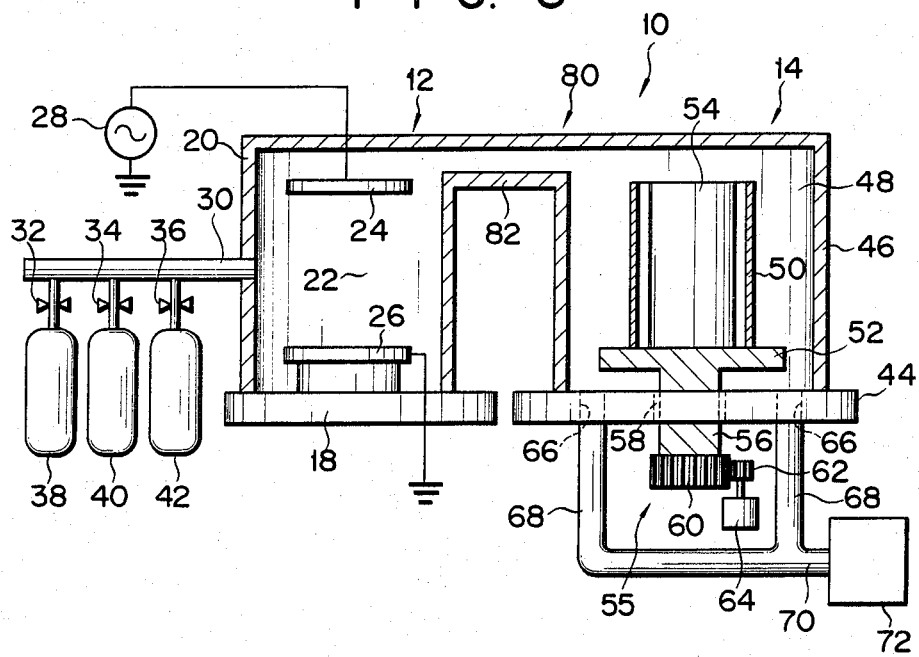
FIG. 3 is a schematic sectional view of a film-fabricating apparatus according to a second embodiment of the invention.

In the first embodiment, the communication device 16 comprised the straight communication pipe 74 for effecting communication between the mutually facing substantially central portions of the first casing 20 and second casing 46 and the baffle board 76 provided in said communication pipe 74. However, the communication pipe 74 need not be limited to the above-mentioned arrangement, but may be constructed as shown in FIG. 3. Namely, in the second embodiment, the communication device 80 comprises a straight communication pipe 82 for communicating between the the upper regions of the mutually facing sections of the first casing 20 and second casing 46. Namely, the communication pipe 82 assures communication between the upper regions of the reaction chamber 22 and film-forming chamber 48. Various activated molecular species grown in the reaction chamber 22 are carried into the film-forming chamber 48 through the communication pipe 82 arranged as described above. Light beams sent forth from a plasma in the reaction chamber 22 have their passage obstructed by the lateral wall of the first casing 20 and are prevented from being carried into the film-forming chamber 48. The communication device 80 enables the second embodiment to achieve the same satisfactory effect as in the first embodiment.

The communication pipe 82 of FIG. 3 need not be the type which effects communication between the upper regions of the mutually facing portions of the first casing 20 and second casing 46. It is possible to has the communication pipe communicate between the lower regions of the mutually facing portions of the first and second casings 20, 46. The point is that the communication pipe 82 be so arranged as to prevent light beams emitted from a plasma in the reaction chamber 22 from entering the film-forming chamber.

Figure 4:
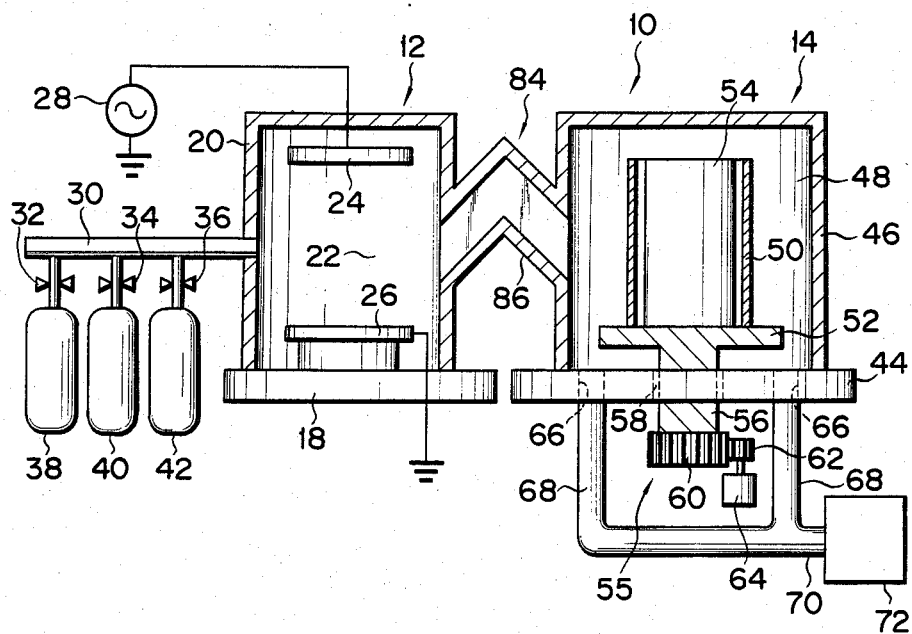
FIG. 4 is a schematic sectional view of a film-fabricating apparatus according to a third embodiment of the invention.

Description will now be given with reference to FIG. 4 of a film-fabricating apparatus and method according to a third embodiment of this invention. The communication device 84 of the third embodiment is provided with a communication pipe 86 whose intermediate part is bent. This communication pipe 86 assures communication between the substantially central regions of the mutually facing portions of the first and second casing 20, 46. The communication pipe 86 is bent to such an extent as prevents light beams sent forth from a plasma in the reaction chamber 22 from being carried into the film-forming chamber 48 through the communication pipe 86. The communication pipe 86 enables the third embodiment of FIG. 4 to achieve the same effect as in the first embodiment of FIG. 1.

Figure 5:
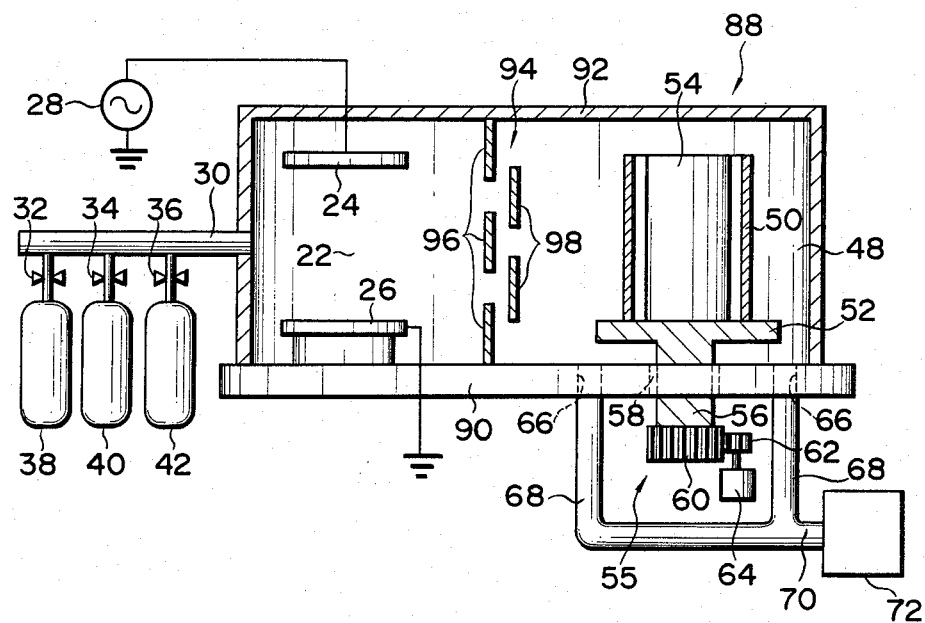
FIG. 5 is a schematic sectional view of a film-fabricating apparatus according to a fourth embodiment of the invention.

Description will now be given with reference to FIG. 5 of a film-fabricating apparatus and method according to a fourth embodiment of this invention. In the first embodiment, the reaction chamber 22 was defined by the first casing 20 and first base board 18, and the film-forming chamber 48 was defined by the second casing 46 and second base board 44. The reaction chamber 22 and film-forming chamber 48 were connected together by the communication device 16. However, this invention need not be limited to such an arrangement. Namely, the invention is practicable in such an arrangement as indicated in FIG. 5. Namely, a film-fabricating apparatus 88 according to the fourth embodiment comprises a common base board 90, and a common casing 92 detachably mounted on said common base board 90.

A communication device 94 is provided in the substantially central region of the casing 92 to divide the interior space of said casing 92 into two regions in a state communicable with each other. The communication device 94 divides the interior of the casing 92 into the left reaction chamber 22 and right film-forming chamber 48 as viewed from FIG. 5. Namely, communication between the reaction chamber 22 and film-forming chamber 48 is assured by the communication device 94. This communication device 94 comprises a first group of partition walls 96 vertically extending at a prescribed distance and a second group of partition walls 98 vertically extending in parallel with said first group of partition walls 96 at a prescribed distance. The first partition walls 96 and second partition walls 98 are arranged in the staggered fashion. The spaces between the vertically arranged partition walls of the first and second groups are made shorter than each of the partition walls 98 of the second group, thereby preventing the light beams emitted from a plasma in the reaction chamber from entering the film-forming chamber 48 through said spaces. The film-fabricating apparatus 88 of FIG. 5 according to the fourth embodiment achieves the same effect as the first embodiment.

Throughout the foregoing embodiments, the substrate 50 was described as having a hollow cylindrical shape. However, the substrate need not have a hollow cylindrical shape, but may be fabricated in the form of a flat board. Further, it was described that a single substrate 50 was received in the film-forming chamber 48. However, it is possible to provide any number of substrates, instead of a single one.

As mentioned above, this invention provides a film-fabricating method and apparatus which enable a film to be fabricated in a short time with high quality and uniform thickness. Particularly where a gas containing silicon and hydrogen is applied as a raw material, hydrogen is effectively coupled with the dangling bond of silicon, thereby assuring the fabrication of a high quality amorphous silicon film having a low spin density as measured by the previously described electron spin resonance (ESR) process.

What is claimed is:

1. A film-fabricating method comprising steps of decomposing a raw gas to generate activated molecular species, reacting the produced activated molecular species, and depositing a thin film of the reacted molecular species on a substrate held in a film-forming chamber, wherein the raw gas is decomposed to produce activated molecular species in a reaction chamber which is separate from the film-forming chamber; and wherein the produced activated molecular species are taken into the film-forming chamber from the reaction chamber through communication means while light beams emitted during decomposition of the raw gas in the reaction chamber are prevented from entering the film-forming chamber through the communication means.

2. The film-fabricating method according to claim 1, wherein the raw gas is decomposed by discharge.

3. The film-fabricating method according to claim 2, wherein the produced activated molecular species are carried into the film-forming chamber while ligth beams are prevented from entering the film-forming chamber.

4. The film-fabricating method according to claim 1, wherein the substrate is made rotatable.

5. The film-fabricating method according to claim 1, wherein the activated molecular species are produced in a decompressed atmosphere before entering the film-forming chamber.

6. A film-fabricating apparatus for depositing a film onto a substrate which comprises:
   a reaction chamber including decomposition means for decomposing a raw gas to produce activated molecular species;
   a film-forming chamber to contain the substrate on which the film is deposited;
   communication means establishing communication between the reaction chamber and film-forming chamber for conducting the activated molecular species produced in the reaction chamber to the film-forming chamber and for preventing light beams emitted during the decomposition of the raw gas from entering into the film-forming chamber;
   supply means which is connected to the reaction chamber, for supplying the raw gas to said reaction chamber; and
   decompression means which is connected to the film-forming chamber, for decompressing the interior of said film-forming forming chamber.

7. The film-fabricating apparatus according to claim 6, wherein the reaction chamber is defined by a space surrounded by a first base board and a first casing mounted on said first base board, and the film-forming chamber is defined by a space surrounded by a second base board and a second casing mounted on said second base board.

8. The film-fabricating apparatus according to claim 7, wherein the communication means is extended between the first and second casings and is provided with a communication pipe for effecting communication between the reaction chamber and film-forming chamber.

9. The film-fabricating apparatus according to claim 8, wherein the communication pipe is extended between the upper region of the first casing and that of the second casing.

10. The film-fabricating apparatus according to claim 8, wherein the communication pipe is extended between the substantially central regions of the mutually facing portions of the first and second casings.

11. The film-fabricating apparatus according to claim 10, wherein the communication pipe is bent substantially at the center.

12. The film-fabricating apparatus according to claim 10, wherein the communication pipe is fabricated in a straight form, and the communication means comprises a baffle board received in the communication pipe, said baffle board being so arranged as to obstruct the passage of light beams but allow for the passage of activated molecular species.

13. The film-fabricating apparatus according to claim 6, wherein the communication means divides into two parts the interior space of said apparatus defined by a common base board and a common casing mounted on said common base board; and one of the two divided regions is used as a film-forming chamber, and the other region is applied as a reaction chamber.

14. The film-fabricating apparatus according to claim 13, wherein the communication means is provided with a baffle board so arranged as to obstruct the passage of light beams, but allow for the passage of activated molecular species.

15. The film-fabricating apparatus according to claim 6, wherein the supply means is adapted to supply raw gas mainly consisting of silicon.

16. The film-fabricating apparatus according to claim 6, wherein the reaction chamber further includes a pair of mutually facing electrodes and a high frequency power source connected to one of said paired mutually facing electrodes, the other of said paired electrodes being grounded and wherein a glow discharge generated across said paired mutually facing electrodes is adopted to decompose the raw gas.

17. The film-fabricating apparatus according to claim 6, further comprising rotating means operatively connected to said film-forming chamber for rotating the substrate in the film-forming chamber.

18. The film-forming apparatus according to claim 6 wherein said communication means includes baffle means to prevent light beams emitted during the decomposition of the raw gas from entering the film-forming chamber but allowing the activated molecular species to enter the film-forming chamber.

19. A film-fabricating apparatus for depositing a film onto a substrate comprising:
   a reaction chamber including decomposition means for decomposing a raw gas to produce activated molecular species;
   a film-forming chamber to contain the substrate on which the film is deposited;
   communication means for establishing communication between said reaction and film-forming chambers; and
   light-beam obstructing means operatively associated with said communication means for obstructing the passage of light beams, emitted during decomposition of the raw gas, from said reaction chamber to said film-forming chamber to prevent said emitted light beams from entering said film-forming chamber while yet permitting said molecular species to pass from said reaction chamber to said film-forming chamber through said communication means.

20. Apparatus as in claim 19 further comprising supply means connected to said reaction chamber for supplying the raw gas to said reaction chamber.

21. Apparatus as in claim 19 further comprising decompression means connected to said film-forming chamber for decompressing the interior of said film-forming chamber.

22. Apparatus as in claim 19 wherein said light-beam obstructing means includes baffle means disposed in said communication means to define baffle passageways for preventing the light beams from entering said film-forming chamber.

23. A film-fabricating method for depositing a film on a substrate comprising the steps of:
   (a) decomposing a raw gas in a reaction chamber to generate activated molecular species;
   (b) establishing communication between the reaction chamber and a film-forming chamber which contains the substrate;
   (c) preventing light beams emitted during decomposition of the raw gas from entering the film-forming chamber from the reaction chamber; and
   (d) depositing a film of the activated molecular species onto the substrate by allowing the activated molecular species to pass into the film forming chamber from the reaction chamber.

* * * * *